United States Patent
Zhang et al.

(10) Patent No.: US 7,526,746 B2
(45) Date of Patent: *Apr. 28, 2009

(54) INCREMENTAL GEOTOPOLOGICAL LAYOUT FOR INTEGRATED CIRCUIT DESIGN

(75) Inventors: Shuo Zhang, Mountain View, CA (US); Yongbo Jia, Fremont, CA (US)

(73) Assignee: Nannor Technologies, Santa Clara, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 11/450,142

(22) Filed: Jun. 9, 2006

(65) Prior Publication Data

US 2006/0288322 A1    Dec. 21, 2006

Related U.S. Application Data

(63) Continuation-in-part of application No. 10/946,918, filed on Sep. 21, 2004, now Pat. No. 7,131,095.

(51) Int. Cl.
*G06F 17/50* (2006.01)

(52) U.S. Cl. ............................... 716/18; 716/2

(58) Field of Classification Search ................ 716/1–2, 716/8, 10–14, 18
See application file for complete search history.

(56) References Cited

U.S. PATENT DOCUMENTS

| 5,604,680 | A | * | 2/1997 | Bamji et al. | 716/8 |
| 6,370,673 | B1 | * | 4/2002 | Hill | 716/2 |
| 6,912,702 | B1 | * | 6/2005 | Iyer et al. | 716/6 |
| 7,131,095 | B2 | * | 10/2006 | Zhang et al. | 716/12 |
| 2006/0064653 | A1 | * | 3/2006 | Zhang et al. | 716/2 |

* cited by examiner

*Primary Examiner*—Stacy A Whitmore
(74) *Attorney, Agent, or Firm*—Lumen Patent Firm

(57) ABSTRACT

Improved integrated circuit (IC) design optimization in the physical design stage after detail routing is provided. A geotopological layout representation is employed, in which some nets are represented by their determined geometrical wiring paths and other nets by their respective wiring topology. In the IC design flow, a routed layout with geometrical wiring paths is transformed into a geotopological layout. All layout modifications are then performed according to the geotopological layout. An embedded design rule checker ensures layout validity. Finally, a new geometrical layout is regenerated accordingly, including all the layout changes for the targeted optimization. This geotopological approach enables an IC designer to modify a routed layout for various optimization targets, while maintaining the exact routing paths of critical nets that are not modifiable. Geotopological layout optimization according to the present invention can be performed on an entire layout, or it can be performed incrementally on one or more sub-layouts of a design.

3 Claims, 4 Drawing Sheets

INCREMENTAL GEOTOPOLOGICAL LAYOUT FOR INTEGRATED CIRCUIT DESIGN

CROSS REFERENCE TO RELATED APPLICATIONS

This application is a continuation in part of U.S. application Ser. No. 10/946,918, entitled "Routed Layout Optimization with Geotopological Layout Encoding for Integrated Circuit Designs", and filed on Sep. 21, 2004 now U.S. Pat. No. 7,131,095.

FIELD OF THE INVENTION

This invention relates to layout optimization of integrated circuit designs.

BACKGROUND

In the highly competitive VLSI (very large scale integration) industry, the insatiable desire for higher chip performance continuously pushes the envelope in integrated circuit (IC) design methodologies. A new design methodology means new design requirements and targets, such as timing, signal integrity (SI), yield, manufacturability, etc. Because products that are late to the market are likely to lose revenue and market share, as the product life cycles become shorter and shorter, the design time also becomes very important. Consequently, achieving a specified chip performance, which continues to increase, within a designated design time frame, which seems to keep shrinking, present a constant challenge to IC designers and engineers alike.

The flow for designing an integrated circuit can be roughly divided into the logical design phase and the physical design phase. The logical design phase includes several design stages: from the design specification to architectural behavioral design stage, to the register transfer level (RTL) design stage, to the gate design stage, after which the logical IC design is ready for the physical design phase. The physical design phase includes floor planning, placement, and routing, which produces the physical IC design layout.

To help defining design parameters and eliminate incorrect design paths early on in the logical design phase, several commercial logic-synthesis tools from companies such as Synopsys offer digital chip analysis and design planning at the gate level. Analysis at the gate level is sufficient for design complexities at around 50,000 to 100,000 gates. Unfortunately, system-on-a-chip (SOC) complexities reaching into the tens of millions of gates have made gate-level design planning inadequate.

Several companies, such as Synopsys, Cadence, Magma, Tera Systems, TransEDA, Sente Inc., to name a few, offer RTL design and planning tools to help IC designers make certain chip-design decisions before logic synthesis. Given an RTL description, these tools can provide an early prediction of how a sub-chip behaves within the context of the entire chip. Without the structural information that is part of a gate-level design description, however, it is very difficult to estimate design parameters, such as on-chip timing delays, power dissipation, and chip size. Indeed, because of the lack of precise geometry information of wires, design verification in stages before detail routing inevitably all must base on some predictions.

In an IC design flow, verification and optimization is used in almost every stage. At the end of physical design flow, the routed layout must again be verified for the specified design requirements. According to the verification results, the routed layout almost always needs to be further optimized to meet various targets. However, due to the high complexity and large scale of the designs, performing an optimization after detail routing (i.e., post-layout optimization) is very difficult and continues to be a challenge today.

In a routed layout, all layout elements including the wire paths are represented by geometrical shapes such as polygons that have precise shape and location. Because layout modifications must not introduce any design rule violation into the design, almost every wire path is restrained by surrounding wires and other layout elements. Whether one modification can be achieved depends entirely on the available local layout resource. In most cases, the local resource is inadequate for any layout change.

The difficulty in post-layout optimization and the fact that engineers generally like to make design decisions as early in the design process as possible explain the lack of viable post-layout optimization tools on the market, contrasting the number of various logical design and planning tools as well as physical placement and routing tools readily available today.

Some known placement and routing tools have the ability to handle engineering change orders (ECOs). This ability allows the designer to go back to the physical design stages like placement or routing to impose more design constraints that represent the preferred layout modifications. The downside is that a typical back-end design iteration usually takes days to process and compute. This approach therefore places a heavy burden on the design time issue as mentioned before. Another drawback is that, due to the indirect approach, the additional design iteration cannot guarantee those layout modifications.

Generally, in the ultra deep sub-micron era, performing the verification and optimization in the early stages of the physical design phase without the precise net wiring, i.e., before detail routing, the verification result is far from the actual layout. Furthermore, verification error is almost unavoidable, which makes the subsequent optimization less effective and useful.

Clearly, there is a need in the art for a new optimization tool, system, and method that enables IC designers to achieve a specified chip performance within a designated design time frame after detail routing without the aforementioned drawbacks and that overcomes the difficult challenges in post-layout optimization. The present invention addresses this need.

SUMMARY

The present invention provides a new approach in optimizing a routed integrated circuit layout. The post-layout optimization tool, system, and method disclosed herein overcomes the geometrical constraints from the net routing paths and, at the same time, preserves the exact routing paths of the unmodifiable nets.

A key element of the present invention is a novel hybrid layout representation referred to as the geotopological layout that simultaneously represents some nets by their determined geometrical wiring paths and some by their wiring topology.

According to an aspect of the invention, in the physical design phase after detail routing, a routed layout with geometrical wiring paths is transformed into a geotopological encoding graph. All layout modifications are then performed according to the geotopological encoding graph. An embedded design rule checker ensures the validity thereof. Finally, a new layout is regenerated accordingly, including all the layout changes for the targeted optimization.

With the geotopological layout encoding graph, a routed layout is readily modifiable for various optimization targets, while advantageously maintaining the exact routing path(s) of unmodifiable nets. Geotopological layout optimization according to the present invention can be performed on an entire layout, or it can be performed incrementally on one or more sub-layouts of a design.

Other objects and advantages of the present invention will become apparent to one skilled in the art upon reading and understanding the preferred embodiments described below with reference to the following drawings.

DETAILED DESCRIPTION

Figure 1:
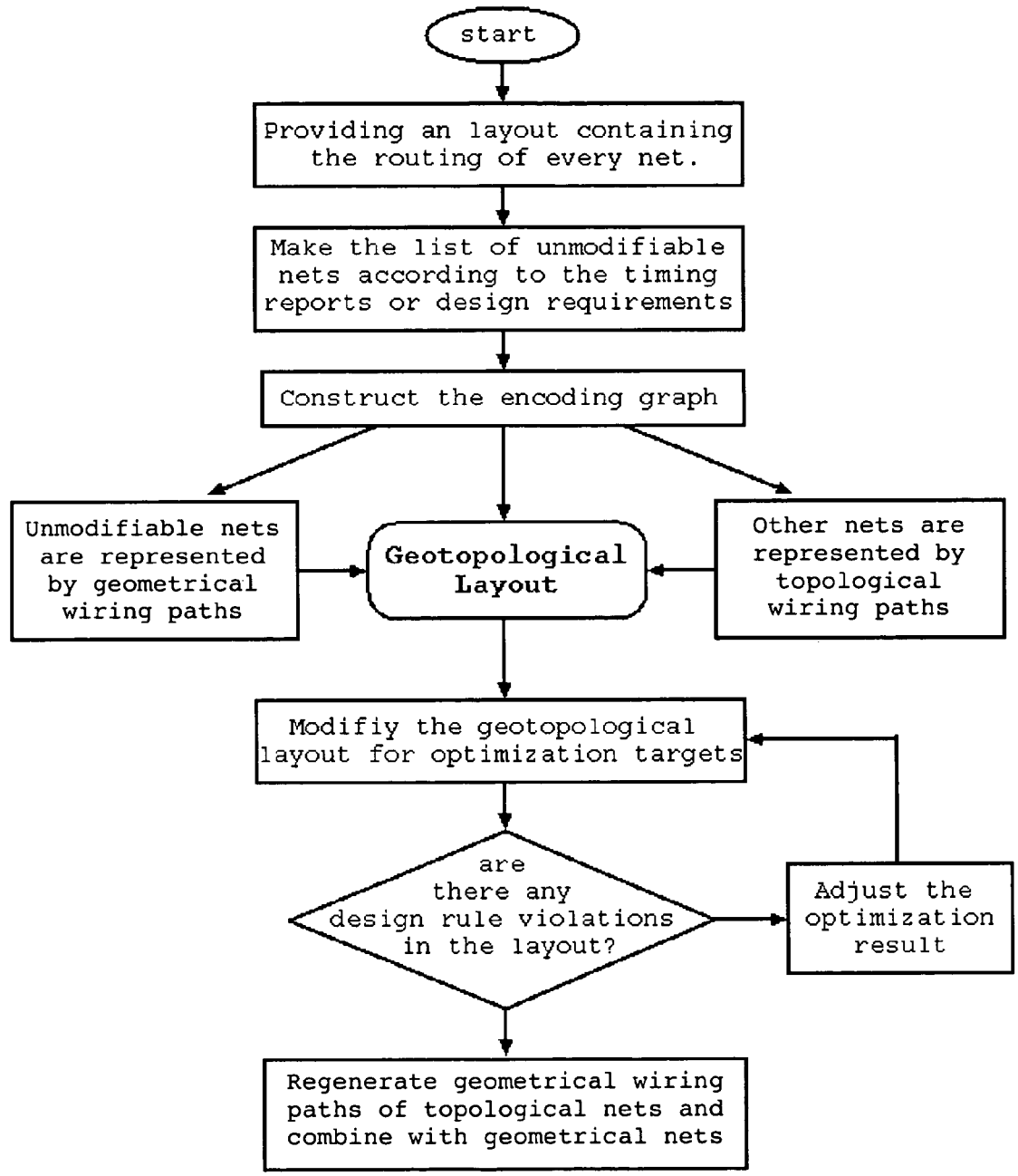
FIG. 1 illustrates how a routed layout is optimally modified in the physical design flow according to an aspect of the present invention.

In the following detailed description, like numbers and characters may be used to refer to identical, corresponding, or similar items in different figures.

An effort has been made to modify the routed layout through the topological representation of the layout, or the topological layout, see, Zhang, S. and Dai, W. "TEG: A New Post-Layout Optimization Method," IEEE Transactions on Computer-Aided Design of Integrated Circuits and Systems, Vol. 22, No. 4, April 2003, pp. 1-12, the content of which is incorporated herein by reference in its entirety, hereinafter referred to as the "topological approach". Readers are directed to the article for further teachings on underlying operations such as layout updates, design rule check, wire representations, etc.

In the topological approach, a topological layout is extracted from the geometrical layout. Specified layout modifications, such as wiring sizing and spacing or rip-up and reroute, are then performed on the topological layout according to desired optimization targets. A topological design rule checker and a design rule violation solver ensure the modified topological layout represent a valid geometrical layout. The modified topological layout is converted back into a geometrical layout and the geometrical wire paths are regenerated according to their topologies.

The topological layout extracted from the geometrical layout only captures the relative positions and connections of layout elements, and contains no geometry information of wires. A wire in the topological layout is represented as spatial relationships with respect to other layout elements.

Although this topology-based approach provides much more flexibility in modifying routed layout than conventional geometry-based methods, a critical problem exists. After a routed layout is processed, even without any modification on the topological layout, the regenerated geometrical layout can still be different from the original geometrical layout. The inconsistency is due to the nature of the topological representation. That is, one topological layout represents a set of multiple geometrical layouts.

Another problem is that the topological optimization flow could change the wire path or the wire length of the timing critical nets, resulting in the timing change of these nets. Since timing is one of the most critical requirements and the design timing margin is getting smaller and smaller because of the increasing clock speed, any small change in these timing critical nets could cause timing violation and design failure.

In addition to the timing critical nets, certain nets, for example, the nets connected to the input and output pins, should not be affected by wire path changes. Although the number of these non-modifiable nets is relatively small compared to the total number of nets in the design, it is impossible to keep these nets intact throughout the design flow. This makes the topological approach impractical in the real IC design world.

The present invention provides a new geotopological post-layout optimization tool, system, and method that is not limited by the geometrical constraints from the net routing paths and that, at the same time, preserves the exact geometrical wiring path of the change-prohibit, non-modifiable nets, thereby overcoming the aforementioned drawbacks of known geometrical and topological approaches in optimizing a routed integrated circuit layout while maintaining the flexibility to effectively modify the routed layout towards optimization targets.

FIG. 1 illustrates how a routed integrated circuit layout is optimally modified in the physical design flow, after floor planning, placement, global routing, and detail routing, in which a detail router provides the exact geometrical position and shape of each routing path to generate the routing paths. First, an integrated circuit design layout is provided with the routing path of every net. This IC design layout is a geometrical layout like the layout 200 shown in FIG. 2.

Next, nets that are not modifiable according to the timing reports or design requirement are identified and listed. These nets have wire paths that should not be changed during the post-layout optimization.

An encoding graph is then constructed to generate a geotopological layout in which unmodifiable nets are represented by their respective geometrical wiring paths while all other nets are simultaneously represented by their respective topological wiring paths which are extracted from the initial geometrical layout.

The geotopological layout is modified based on the optimization requirements and checked for design rule violations. A design rule violation means that a geometrical layout cannot be regenerated from the geotopological layout without any design rule violations. If one or more violation exists, the geotopological layout is modified again by adjusting the optimization result until there are no more violations. The geometrical wiring path of every net represented topologically is combined with the geometrical wiring paths of unmodifiable nets to generate a new optimized geometrical layout that satisfies the design requirements.

The geotopological layout is a key element of the post-layout optimization disclosed herein. It retains the advantages of both traditional geometrical approach and the relatively new topological approach and yet avoids the respective drawbacks thereof. In particular, the wire paths of most nets are represented by their wiring topologies, which brings the maximum modification flexibility to the layout optimization. Moreover, the wire paths of modification sensitive nets (i.e., unmodifiable nets) are kept intact, which ensure the timing correctness of the design after optimization.

Figure 2:
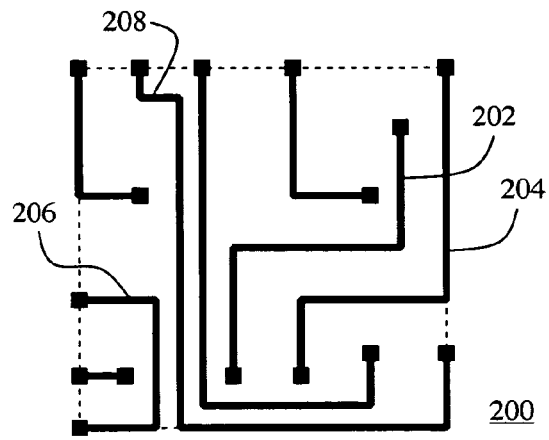
FIG. 2 is a simplified initial geometrical layout after detail routing.
Figure 3:
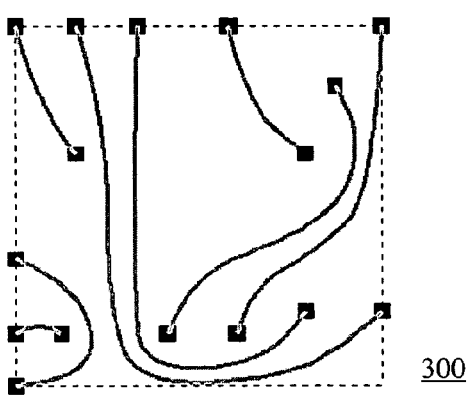
FIGS. 3-6 compare the geotopological approach according to the present invention with a topological approach developed by the inventor.
Figure 4:
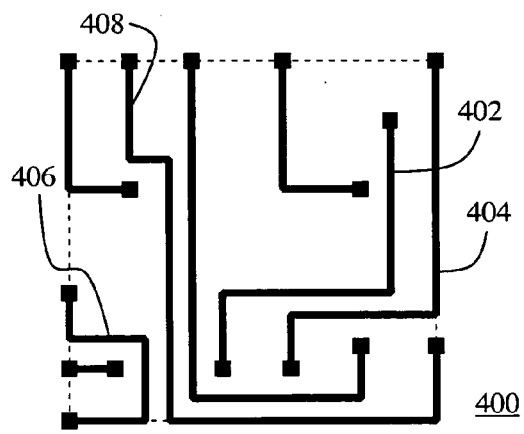
Figure 5:
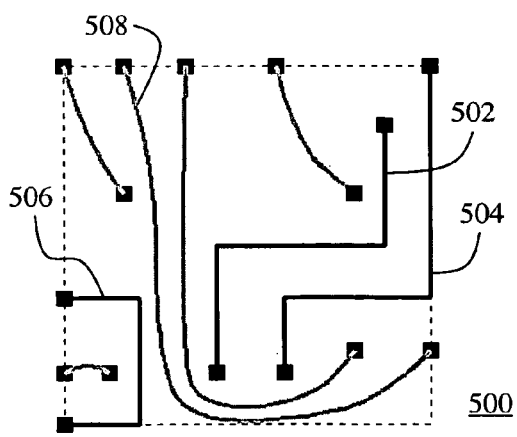
Figure 6:
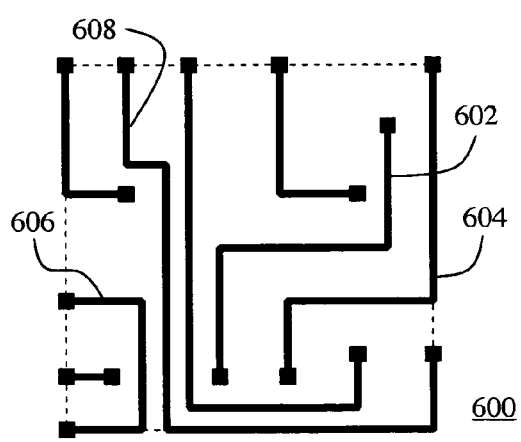

FIGS. 2-6 further illustrate the problem of topological approach to post-layout optimization and demonstrate why the geotopological approach according to the present invention is superior and far more practical. FIG. 2 shows a sample initial geometrical layout 200 having a plurality of geometrical wiring paths such as wiring paths 202-208. FIGS. 3-4 show the topological approach and FIGS. 5-6 show the geotopological approach according to the present invention.

More specifically, FIG. 3 shows a topological layout 300 in which every geometrical wiring path in FIG. 2 is represented by its wiring topology in FIG. 3. FIG. 4 shows a geometrical layout 400 converted from the topological layout 300 without any changes thereto. Due to the nature of the topological representation that one topological layout represents a set of multiple geometrical layouts, even though no changes were made, the geometrical wiring paths 402-408 are different from the geometrical wiring paths 202-208 of the same nets, respectively.

The topological layout 300 does not retain the geometrical constraints of the geometrical layout 200. Consequently, suppose that nets 202 and 204 are timing critical nets and are not supposed to be modified, for instance, because of the crosstalk effect, the smaller distance between 402 and 404 will cause a timing violation. This is a significant drawback of the topological approach.

FIG. 5 shows a geotopological layout 500 that is constructed from the geometrical layout 200 according to the present invention. In this example, nets 202-206 are identified as unmodifiable nets and are therefore represented in the geotopological layout 500 as geometrical wiring paths (solid lines) 502-506, while modifiable nets are represented as topological wiring paths (shaded lines). The geotopological layout 500 is then modified according to the optimization target and checked/adjusted for design rule violations as discussed above with reference to FIG. 1.

FIG. 6 shows a geometrical layout 600 regenerated from the geotopological layout 500 according to the present invention. The regenerated geometrical layout 600 retains critical geometrical constraints of the initial geometrical layout 200 while allowing non-critical wiring paths to be optimally modified. Specifically, wiring paths 602-606 have the same geometrical constraints as the timing critical nets 202-206 in the initial geometrical layout 200. On the other hand, non-critical wiring paths such as net 208 are modified according to the specified optimization target.

FIGS. 7-10 illustrate how a geotopological layout is described by a geotopological encoding graph and how to construct the geotopological layout encoding graph from a given geometrical layout. Mathematically, the geotopological encoding graph is a constrained triangulation graph G(V, E). The vertex set V includes (1) terminal vertices T, such as pins, vias, routing Steiner points, and routing turn points of the unmodifiable nets; (2) obstacle vertices O, the vertices of the polygon boundary of every obstacle; and (3) layout boundary vertices B. The edge set E is a set of edges that make G a valid constrained triangulation of vertex set V, where the constrained edges include (1) routing path segments of each unmodified net; (2) obstacle boundary edges; and (3) layout boundary edges. Each edge is embedded with routing information, indicating either the nets crossing it or the net going along with it.

Figure 7:
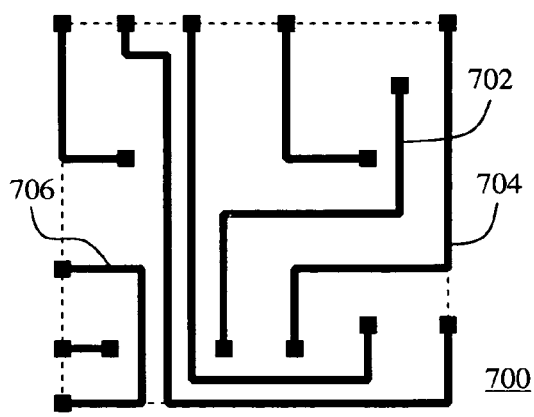
FIGS. 7-10 show how a geotopological encoding graph describes a geotopological layout and how the geotopological encoding graph is constructed from a given geometrical layout.
Figure 8:
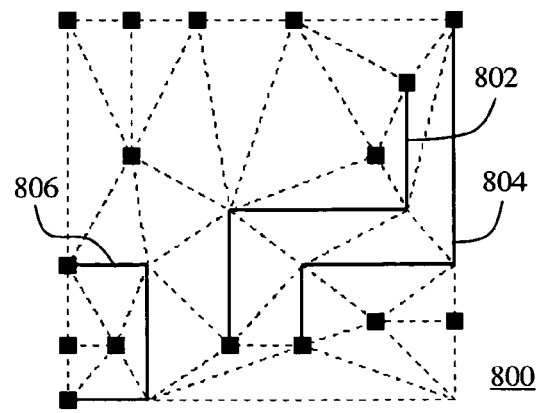

FIG. 7 shows a geometrical layout 700 in which nets 702-706 are timing critical nets and therefore should not be modified during the post-layout optimization. A constrained triangulation graph G(V,E) 800 is constructed as shown in FIG. 8.

In this graph, the vertex set V includes the routing terminals (solid squares) and the routing turn points of the unmodifiable wiring paths 802-806. Every routing segment of the unmodifiable wiring paths 802-806 contain constrained edges.

Figure 9:
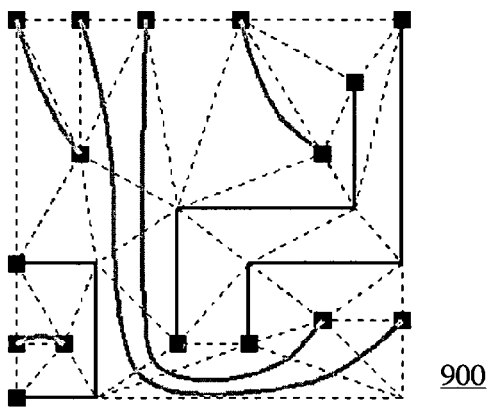
Figure 10:
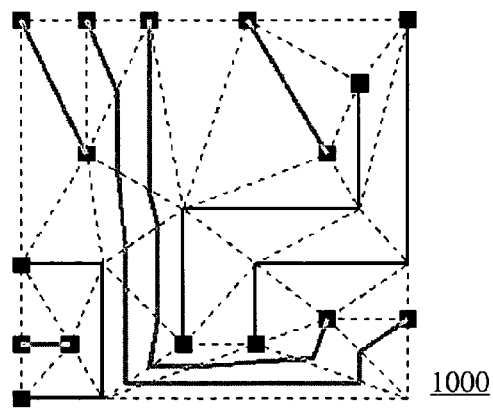

FIG. 9 illustrates a geotopological layout 900 encoded with the constrained triangulation graph 800. Based on the geotopological layout 900, the embedded routing information on the edges is generated. For edges that have a routing path going along therewith, the embedded routing information indicates whether this path belongs to a critical, unmodifiable net or a regular, modifiable net. For edges that have one or more nets crossing over therewith, the routing information indicates the sequence of the nets crossing. The final geotopological layout encoding graph 1000 is shown in FIG. 10. For the sake of clarity, the net-edge crossing points are shown as having uniformly distributed spacing between the crossing nets on the edge. One skilled in the art will recognize that this is not necessarily the case in practice.

When a geotopological layout is modified, as described above with reference to FIG. 1, the constrained layout triangulation is updated accordingly. Any routing terminals can be moved without considering the surrounding topological nets. The constrained edges representing the unmodifiable nets are kept intact, i.e., unchanged, which ensures that the routing of these nets will not be affected at all throughout the post-layout optimization process.

One skilled in the art will appreciate that the present invention is a significant improvement over the topological approach, although it is a little more complicated due to the additional geometrical information. As described above, the geotopological approach disclosed herein has the ability to maintain the exact routing paths of unmodifiable nets, which is critical in solving many post-layout optimization problems in the real design world.

With the geotopological encoding graph, any geometrical layout can be represented by a geotopological layout. The underlying layout operations are further improved from the topological layout operations disclosed in the above-referenced article. Some of the important differences are described below.

According to an aspect of the present invention, in the layout updating operation or the vertex moving process, the vertices belong to the unmodifiable nets are not movable. In addition, the vertex-moving path cannot cross any constrained edges that represent the unmodifiable net routing path.

According to another aspect of the present invention, in the layout design rule check operation and the vertex sealing process, there are no design rule violations on the constrained edges. Moreover, when the sealing process reaches a constrained edge in the expansion step, the process needs to check the possible design rule violations between the base vertex and the constrained edge. When no violation is detected, the sealing process stops and the corresponding sealing pair is sealed.

It is important to note that, in the wire regeneration operation, the nets represented as geometrical wiring paths in the geotopological layout do not require any special attention since they already have the geometrical routing paths.

Figure 11:
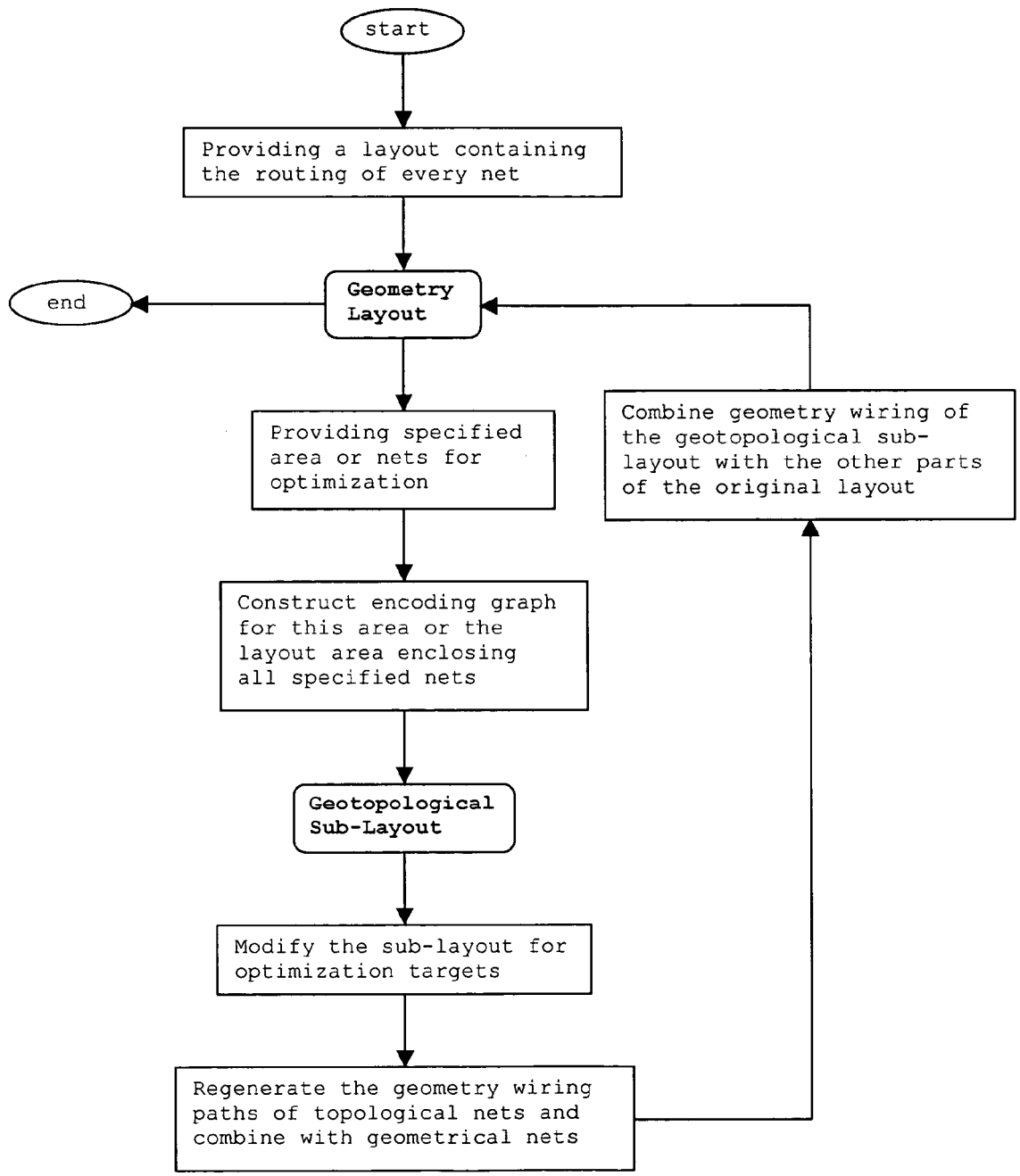
FIG. 11 illustrates how a routed layout is optimally modified in the physical design flow according to another aspect of the present invention.

Geotopological layout according to the principles of the invention can be applied to an entire layout and/or it can be applied to one or more sub-layouts of a particular design. In other words, geotopological optimization can be applied either incrementally or non-incrementally to optimize a given design. FIG. 11 shows an example of incremental geotopological optimization.

In such an incremental approach, specific portions (i.e., nets or areas) of a geometrical layout are specified for optimization, thereby defining sub-layout regions. Within each of these specified portions, geotopological optimization as described above can be performed (i.e., with some parts of the sub-layout being geometrically fixed, and other parts of sub-layout being only topologically fixed). Upon completion of this optimization step, the optimized sub-layouts can be re-integrated into the original layout.

Techniques for selecting sub-layout regions for incremental processing and for re-integrating optimized sub-layouts into the original layout are known in the art in connection with incremental implementation of conventional layout optimization methods. Accordingly, no further description of such selecting and re-integrating is provided.

As one skilled in the art will appreciate, most digital computer systems can be programmed to implement the present invention. To the extent that a particular computer system configuration is programmed to implement the present invention, it becomes a digital computer system within the scope and spirit of the present invention. That is, once a digital computer system is programmed to perform particular functions pursuant to computer-executable instructions from program software that implements the invention described heretofore, it in effect becomes a special purpose computer particular to the present invention. The necessary programming-related techniques are well known to those skilled in the art and thus are not further described herein for the sake of brevity.

Computer programs implementing the invention described herein can be distributed to users on a computer-readable medium such as floppy disk, memory module, or CD-ROM and are often copied onto a hard disk or other storage medium. When such a program of instructions is to be executed, it is usually loaded either from the distribution medium, the hard disk, or other storage medium into the random access memory of the computer, thereby configuring the computer to act in accordance with the invention disclosed herein. All these operations are well known to those skilled in the art and thus are not further described herein. The term "computer-readable medium" encompasses distribution media, intermediate storage media, execution memory of a computer, and any other device capable of storing for later reading by a computer a computer program implementing the invention disclosed herein.

Although the present invention and its advantages have been described in detail, it should be understood that the present invention is not limited to or defined by what is shown or described herein. As one of ordinary skill in the art will appreciate, various changes, substitutions, and alterations could be made or otherwise implemented without departing from the principles of the present invention. Accordingly, the scope of the present invention should be determined by the following claims and their legal equivalents.

The invention claimed is:

1. A method of automatically optimizing an initial geometrical layout of an integrated circuit design according to one or more optimization requirements, the method comprising:

selecting one or more portions of the initial geometrical layout for geotopological optimization;

constructing a geotopological encoding graph of each of the portions that encodes unmodifiable nets of the initial geometrical layout geometrically and encodes modifiable nets of the initial geometrical layout topologically;

generating a geotopological layout of each of the portions that represents the unmodifiable nets with geometrical wiring paths and represents the modifiable nets with topological wiring paths;

modifying the geotopological layout of each of the portions in accordance with the optimization requirements;

transforming the modified geotopological layout of each of the portions to generate an intermediate geometrical layout of each of the portions; and combining the intermediate geometrical layout of each of the portions with unselected portions of the initial geometrical layout to provide an optimized geometrical layout of the integrated circuit design.

2. A computer system programmed to perform a method comprising:

selecting one or more portions of the initial geometrical layout for geotopological optimization;

constructing a geotopological encoding graph of each of the portions that encodes unmodifiable nets of the initial geometrical layout geometrically and encodes modifiable nets of the initial geometrical layout topologically;

generating a geotopological layout of each of the portions that represents the unmodifiable nets with geometrical wiring paths and represents the modifiable nets with topological wiring paths;

modifying the geotopological layout of each of the portions in accordance with the optimization requirements;

transforming the modified geotopological layout of each of the portions to generate an intermediate geometrical layout of each of the portions; and combining the intermediate geometrical layout of each of the portions with unselected portions of the initial geometrical layout to provide an optimized geometrical layout of the integrated circuit design.

3. A computer readable medium storing a computer program that implements a method comprising:

selecting one or more portions of the initial geometrical layout for geotopological optimization;

constructing a geotopological encoding graph of each of the portions that encodes unmodifiable nets of the initial geometrical layout geometrically and encodes modifiable nets of the initial geometrical layout topologically;

generating a geotopological layout of each of the portions that represents the unmodifiable nets with geometrical wiring paths and represents the modifiable nets with topological wiring paths;

modifying the geotopological layout of each of the portions in accordance with the optimization requirements;

transforming the modified geotopological layout of each of the portions to generate an intermediate geometrical layout of each of the portions; and combining the intermediate geometrical layout of each of the portions with unselected portions of the initial geometrical layout to provide an optimized geometrical layout of the integrated circuit design.

* * * * *